(12) United States Patent
Huang et al.

(10) Patent No.: US 6,358,760 B1
(45) Date of Patent: Mar. 19, 2002

(54) METHOD FOR AMORPHOUS SILICON LOCAL INTERCONNECT ETCH

(75) Inventors: Jiahua Huang; Allison Holbrook, both of San Jose; James H. Chiang, Mountain View; Sunny Cherian, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/583,552

(22) Filed: Jun. 1, 2000

(51) Int. Cl.[7] .................. H01L 21/00; H01L 21/302; G01R 31/00
(52) U.S. Cl. .................. 438/9; 438/6; 438/7; 438/8; 438/706; 438/710; 438/714; 216/60
(58) Field of Search .................. 438/706–714, 438/719, 5–9, 10; 216/58–61

(56) References Cited

U.S. PATENT DOCUMENTS 5,413,950 A * 5/1995 Chen et al. .................. 438/253
5,728,253 A * 3/1998 Saito et al. .................. 156/345
5,989,928 A * 11/1999 Nakata et al. .................. 438/7

* cited by examiner

Primary Examiner—John F. Niebling
Assistant Examiner—Ha Tran Nguyen
(74) Attorney, Agent, or Firm—Harrity & Snyder, L.L.P.

(57) ABSTRACT

A silicon layer is etched using a plasma etcher equipped with an endpoint control device. $CF_4$ and $N_2$ are provided to the plasma etcher at lower flow rates than those typically used during fixed time etching processes. The endpoint control device monitors optical emissions from the etching chamber at a particular wavelength to detect a predetermined change in intensity. When the change in intensity is detected, the etching is terminated.

18 Claims, 5 Drawing Sheets

METHOD FOR AMORPHOUS SILICON LOCAL INTERCONNECT ETCH

TECHNICAL FIELD

The present invention relates to a method of manufacturing a semiconductor device. The present invention has particular applicability in manufacturing high density semiconductor devices using local interconnect conductors.

BACKGROUND ART

Current demands for high density and performance associated with ultra large scale integration semiconductor devices require submicron features, increased transistor and circuit speeds and high reliability. Such demands for increased density, performance and reliability require formation of device features with high precision and uniformity.

Conventional semiconductor devices typically comprise a semiconductor substrate, normally made of monocrystalline silicon, and multiple dielectric and conductive layers formed thereon. An integrated circuit is formed containing multiple conductive patterns comprising conductive lines separated by interwiring spacings, and multiple interconnect lines, such as bus lines, bit lines, word lines and local interconnect lines.

As device features continue to shrink in size, the local interconnect lines enable the semiconductor device to offer more packing density, higher speeds and more flexibility in circuit design. In conventional local interconnect methodology, amorphous silicon may be deposited over titanium. The amorphous silicon may then be patterned with a local interconnect resist mask. Subsequently, the amorphous silicon areas that are not covered by the resist mask are etched away using an amorphous silicon etch. A high temperature rapid thermal anneal (RTA) follows to form a titanium silicide local interconnect conductor.

A consistent and precise etching of the amorphous silicon layer is essential for predictable device performance. For example, incomplete etching leaves an amorphous silicon residue over the semiconductor device that may subsequently cause device failures due to electrical shorts. Additionally, over etching may cause the loss of amorphous silicon that is to be used to form the titanium silicide local interconnect conductor. This may result in a higher resistance for the local interconnect conductor, thereby lowering the device speed. Over etching may also unintentionally cause the loss of titanium formed beneath the amorphous silicon layer. This unintentional loss of titanium may adversely impact the formation of a titanium silicide layer at the surface of the source/drain regions.

Conventional processes for etching amorphous silicon employ a plasma etching chamber using fluorine-based reactants and a fixed time etch. For example, according to conventional methodology, $CF_4$ and $N_2$ may be used to plasma etch amorphous silicon for a predetermined period of time, based on the thickness of the amorphous silicon layer. Conventionally, the $CF_4$ is provided at a flow rate of about 140 standard cubic centimeters per minute (sccm) and the $N_2$ is provided at a flow rate of about 25 sccm. Additionally, the pressure in the etching chamber in conventional fixed time etching processes is maintained at about 800 milliTorr (mT). One drawback with such conventional fixed time etching processes is that the etch rate and film variations make it very difficult to achieve a precise etch. As a result, the end product after etching often yields inconsistent results. That is, the semiconductor device may suffer from over etching on some occasions while on other occasions, the semiconductor device may suffer from under etching.

Another drawback with conventional amorphous silicon etching is that a heavy polymer forms in the plasma etching chamber during etching. These polymers significantly change the etching chamber conditions. As the number of wafers processed in the chamber increases, the polymer built up in the chamber will progressively slow down the amorphous silicon etch rate. Accordingly, amorphous silicon residues are often seen from wafer to wafer because of inefficient etching caused by the decreased etch rate. Additionally, the polymers themselves often leave residues on the semiconductor devices after the etching. Conventional methods to clean the post-etch polymer residues are often ineffective in cleaning the residues without attacking the underlying titanium.

DISCLOSURE OF THE INVENTION

There exists a need for methodology that eliminates the problems associated with etching amorphous silicon.

These and other needs are met by the present invention, where a plasma etching device is used to etch an amorphous silicon layer formed over a titanium layer. The plasma etching device uses an endpoint detector to detect when the amorphous silicon not covered by a resist mask has been completely etched. A titanium silicide interconnect may then be formed by annealing the semiconductor device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method for etching a semiconductor device in a plasma etching chamber. The semiconductor device includes a silicon layer formed over a titanium layer. The method includes providing $CF_4$ and $N_2$ into the plasma etching chamber. The method also includes etching the semiconductor device in the plasma etching chamber and monitoring optical emissions from the plasma etching chamber. The method further includes terminating the etching when an intensity of the optical emissions reaches a predetermined level.

According to another aspect of the invention, a method for manufacturing a semiconductor device is provided. The method includes forming a dielectric layer on an upper surface of a semiconductor substrate, forming a gate electrode on the dielectric layer and sequentially depositing a titanium layer and a silicon layer over the gate electrode. The method also includes forming a mask over predetermined portions of the silicon layer, the predetermined portions defining a local interconnect line. The method further includes etching the silicon layer in a plasma etching chamber, monitoring optical emissions from the plasma etching chamber and terminating the etching when an intensity of the optical emissions reaches a predetermined level.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation represent like elements throughout.

BEST MODE FOR CARRYING OUT THE INVENTION

The present invention addresses and solves the problems of inconsistent etching associated with etching an amorphous silicon layer using fixed time etching, thereby enabling the formation of a local interconnect having increased reliability.

Figure 1:
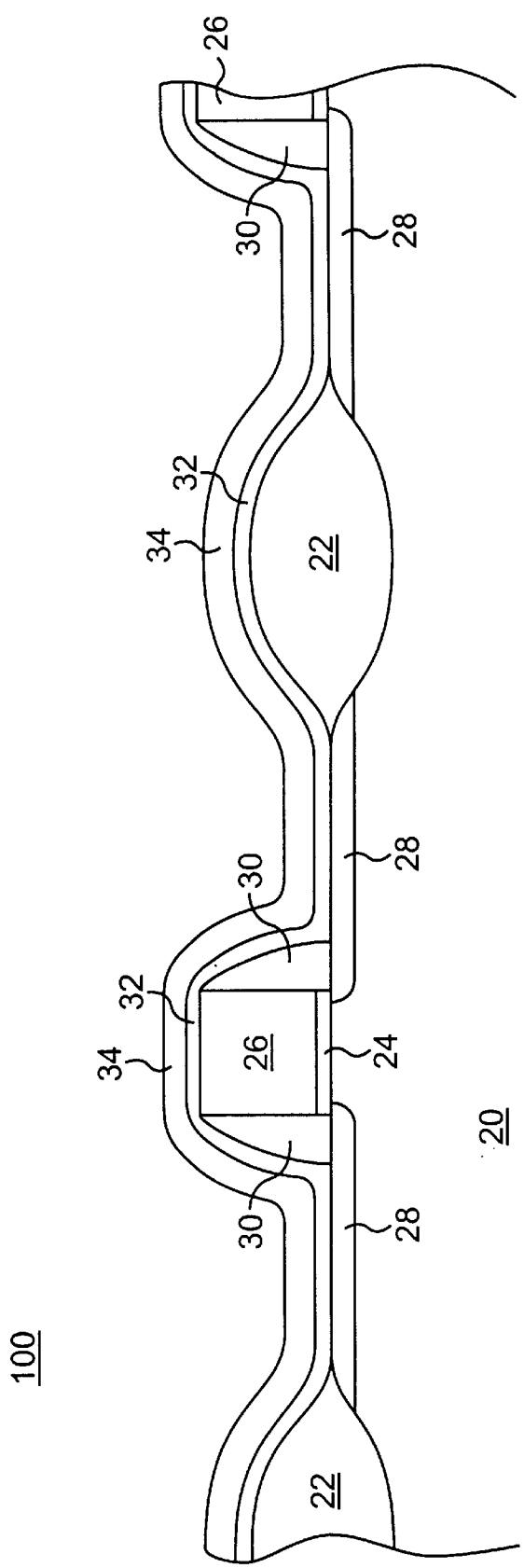
FIG. 1 schematically illustrates the cross-section of a semiconductor device formed in accordance with an embodiment of the present invention.

FIG. 1 illustrates the cross-section of a semiconductor device 100 formed in accordance with an embodiment of the present invention. Referring to FIG. 1, substrate 20 typically comprises monocrystalline silicon. A field oxide 22 is grown on the semiconductor substrate 20 in a conventional manner to separate active device areas on semiconductor device 100. A gate dielectric layer 24, such as a silicon oxide, is then formed on semiconductor substrate 20.

A conductive layer, such as polycrystalline silicon, is then deposited on the gate dielectric layer 24 and patterned in a conventional manner to form gate electrode 26. Impurities are then ion implanted, using gate electrode 26 as a mask, to form source/drain implants 28. N-type or P-type impurities may be implanted, depending upon whether an N-channel MOSFET or a P-channel MOSFET is desired.

Subsequent to the source/drain implantation, insulating sidewall spacers are formed on each side surface of the gate electrode 26. The sidewall spacers 30 may be formed by depositing a layer of dielectric material, such as a silicon nitride or silicon oxide, and then etching the dielectric material to form the sidewall spacers 30. After the sidewall spacers 30 are formed, additional ion implantation may be performed to form the source/drain regions. Subsequently, dielectric residues are removed to expose the surface of the implanted semiconductor substrate 20 adjacent sidewall spacers 30.

A titanium layer 32 is then deposited over the semiconductor device 100, followed by the deposition of an amorphous silicon layer 34. These two layers, as described in more detail below, are subsequently used to form a local interconnect conductor. The titanium layer 32 and the amorphous silicon layer 34 may be deposited to achieve any particular thickness based on the particular design requirements. For example, it has been found suitable to form titanium layer 32 having a thickness of about 630 Å to about 770 Å. It has also been found suitable to form amorphous silicon layer 34 having a thickness of about 680 Å to about 840 Å. The amorphous silicon layer 34 provides a source of silicon for the formation of the titanium silicide local interconnect conductor.

Figure 2:
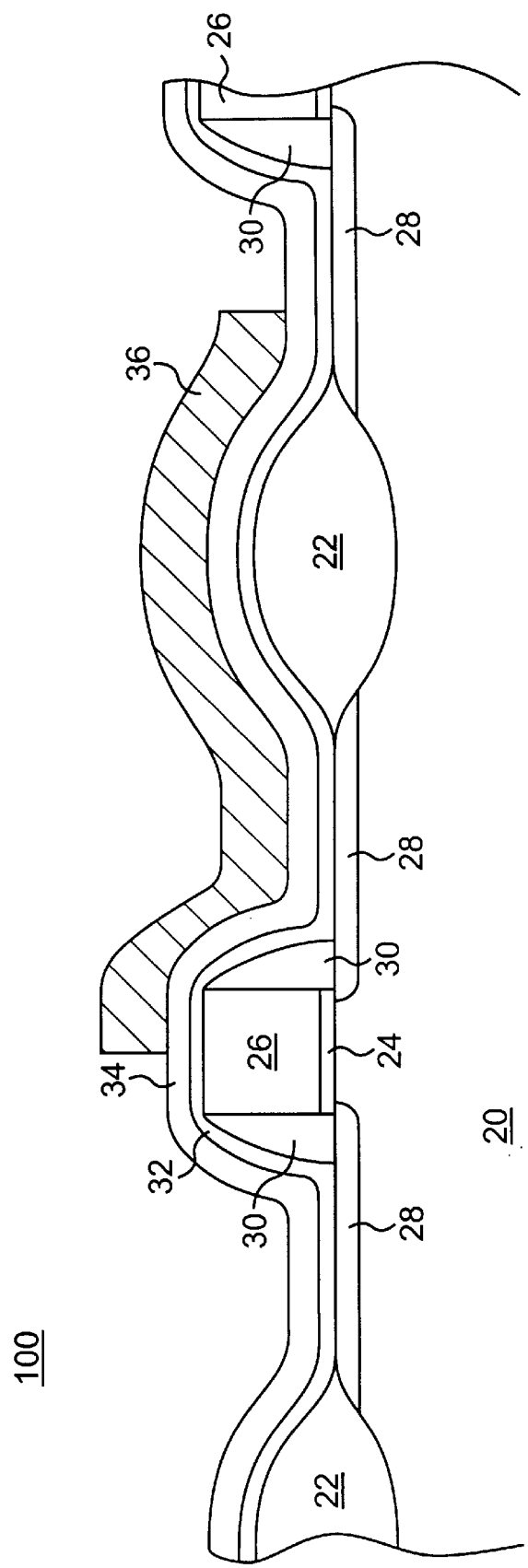
FIG. 2 schematically illustrates the formation of a local interconnect mask formed in accordance with an embodiment of the present invention.

A local interconnect resist mask 36 is then formed, as illustrated in FIG. 2, in a conventional manner over the portions of the amorphous silicon layer 34 that will be used to form the titanium silicide local interconnect conductor. Referring to FIG. 2, the resist mask 36 is shown being formed over a portion of gate electrode 26 and extending laterally beyond field oxide region 22. It should be understood, however, that the resist mask 36 may be formed anywhere a local interconnect is desired, based on the particular circuit design requirements. After forming the resist mask 36, the semiconductor device 100 is subjected to an amorphous silicon etch.

As discussed previously, conventional practices for performing the amorphous silicon etch employ a plasma etcher and fluorine-based reactants for a fixed period of time. The present invention departs from conventional methodology by utilizing an endpoint detection device coupled to the plasma etcher to determine when the amorphous silicon layer 34 has been completely etched.

According to an exemplary embodiment of the present invention, a conventional plasma etcher equipped with an endpoint control device is employed. The endpoint control device detects changes in optical emission intensity from either a reactant or a product in a plasma. For example, the plasma chamber may include a wavelength filter that permits light of specific wavelengths to pass. The endpoint control device then measures the intensity of these analog waveforms at the predetermined wavelength. When the endpoint detector detects a predetermined change in intensity of the waveforms, this indicates that the endpoint has been reached. After the endpoint has been detected, which indicates that the amorphous silicon has been etched, the endpoint control device sends a signal to the plasma etcher. The power to the plasma etcher may then be turned off, thereby resulting in consistent, precise etching regardless of the conditions in the plasma etching chamber, such as the amount of polymer residue built up in the etching chamber. In this manner, the amorphous silicon is completely etched without etching the underlying titanium, resulting in highly reliable local interconnects for use throughout the semiconductor device 100, as described in more detail below.

PLASMA ETCHING AMORPHOUS SILICON

As described previously, conventional fixed time plasma etching uses high flow rates of $CF_4$ and $N_2$ in the plasma etching chamber to etch the amorphous silicon layer. For example, in a conventional fixed-time etching process, the $CF_4$ is provided to the etching chamber at a flow rate of about 140 sccm and the $N_2$ is provided at a flow rate of about 25 sccm. The etching chamber is typically set to 800 mT while the etching proceeds for the predetermined period of time.

According to an exemplary embodiment of the present invention, $CF_4$ and $N_2$ are provided to the plasma etching chamber at flow rates lower than the flow rates conventionally used in fixed time etching. The present invention further departs from conventional technology by setting the pressure in the plasma etching chamber to a higher pressure than that used during the fixed time etching process described previously. It has been found that when the particular flow rates and pressures employed in the present invention are used to plasma etch the semiconductor device 100, a monitoring device, such as an endpoint control device, can be used to detect the change in the intensity of the optical emissions associated with etching amorphous silicon versus etching titanium. By detecting the change in intensity of emissions at a particular wavelength, an endpoint detector can terminate the etching process, as described in more detail below.

According to an exemplary embodiment, the semiconductor device 100 illustrated in FIG. 2 may be placed in a plasma etching chamber. $CF_4$ is then provided to the plasma etching chamber at a flow of approximately 85 sccm±10 sccm. $N_2$ may is also concurrently provided to the plasma etching chamber at a flow of about 15 sccm±5 sccm. In certain embodiments of the present invention, an inert gas, such as argon, may also be supplied to the plasma etching chamber at various flow rates. The pressure in the plasma etching chamber during the plasma etching is maintained at approximately 1000 mT±100 mT, as opposed to pressures of approximately 800 mT used in conventional fixed time etching processes. Such reactant flow rates and pressure in the plasma etching chamber have been advantageously found to provide for adequate etching of the amorphous silicon layer 34 (FIG. 2), while also enabling an endpoint detector to determine when the amorphous silicon layer 34 has been completely etched.

In conventional plasma etching, the emission wavelength associated with monitoring a fluorine reactant is 704 nanometers (nm) and the emission wavelength associated with monitoring an SiF etching by-product is 777 nm. However, the intensity of emissions associated with each of these two wavelengths does not significantly change when the amorphous silicon gets completely etched and the underlying titanium is exposed. Therefore, conventional processes use a fixed time etch to estimate when the amorphous silicon is completed etched.

According to the exemplary embodiment of the present invention, it has been found that using the particular flow rates and pressures described above, an endpoint detector can detect the change in intensity of optical emissions with a wavelength of about 362 nm±2 nm (i.e., about 360 nm to about 364 nm) during the plasma etching. In one embodiment of the present invention, a light filter may be used that permits light with wavelengths between 360 and 364 nm to pass and attenuates light of all other wavelengths. The detected change in intensity represents the emissions associated with etching amorphous silicon layer 34 as opposed to etching the underlying titanium layer 32. In this manner, when the endpoint detector detects the change in intensity, the etching process may be terminated.

Figure 3:
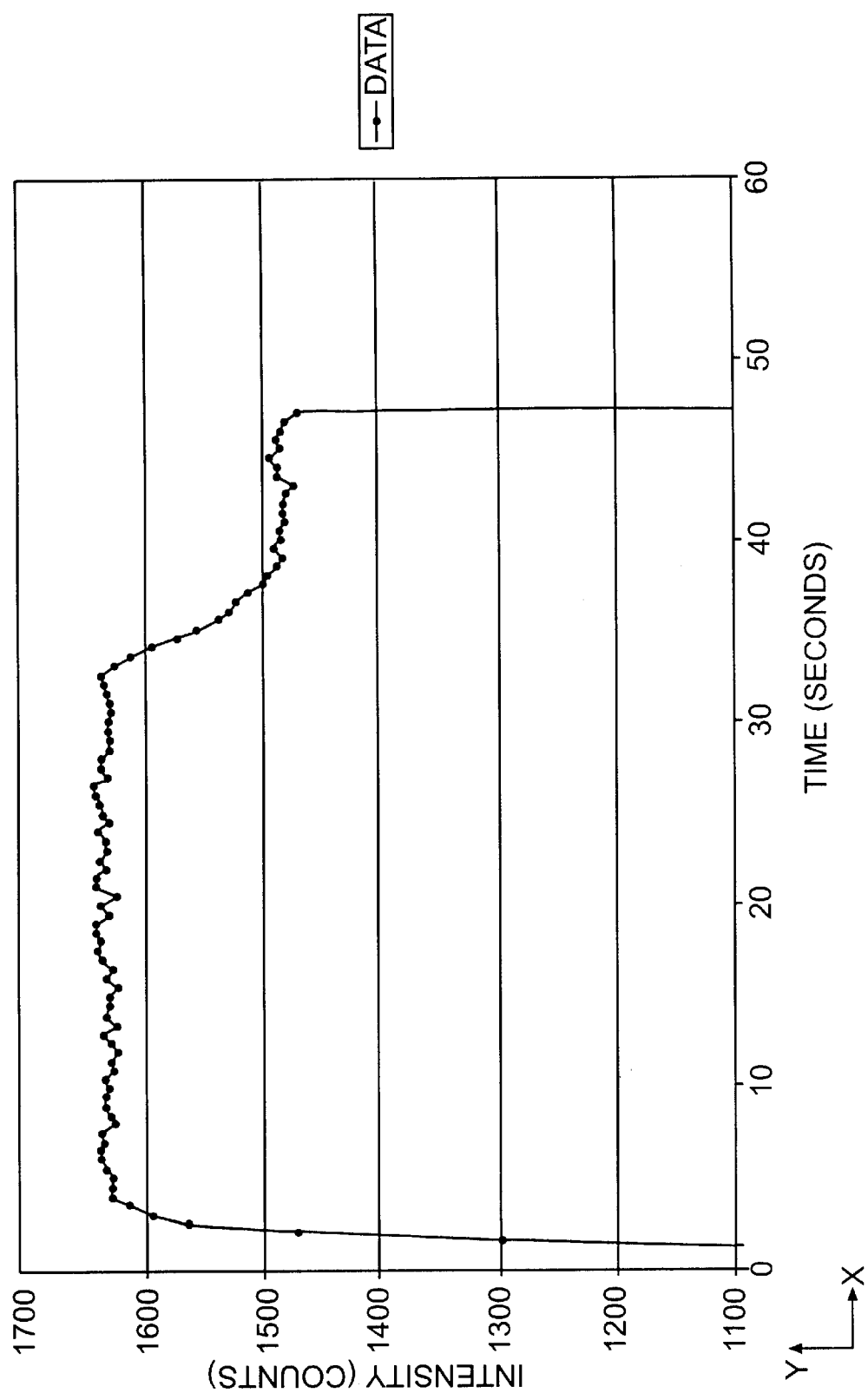
FIG. 3 illustrates a graph of optical emissions versus time for the semiconductor device of FIG. 2, in accordance with an exemplary embodiment of the present invention.

FIG. 3 illustrates an example of monitoring optical emissions for the semiconductor device 100 in accordance with an embodiment of the present invention. In the example illustrated in FIG. 3, $CF_4$ was provided to the plasma etching chamber at a flow rate of approximately 85 sccm and $N_2$ was provided to the plasma etching chamber at a flow rate of approximately 15 sccm. Argon was also supplied to the plasma etching chamber at a flow rate of approximately 200 sccm. It should be noted that the particular flow rate of argon is not critical to the practice of the present invention and other inert gases could alternatively be provided. Additionally, the pressure in the plasma etching chamber was maintained at approximately 1000 mT during the etching. The endpoint detector was set to monitor optical emissions from the plasma etching chamber with a wavelength of 362 nm.

The particular plasma etching device used in the example illustrated in FIG. 3 was a conventional plasma etcher equipped with endpoint control manufactured by Lam Research, model number 4520i. The power supplied to the plasma etcher was approximately 700 watts. It should be noted that other plasma etchers could also be used and the particular flow rates and pressures maintained in the etching chamber may be optimized based on the particular chamber used and the guidance given herein.

Referring to FIG. 3, the optical emission intensity is plotted on the Y axis versus time on the X axis. The intensity is plotted in "counts." Conventional endpoint detectors typically detect and measure the emission intensity in analog volts and then convert the volts to a count value. The count value is then used by a digital control device, such as a conventional digital signal processor, to detect the endpoint. In the example illustrated in FIG. 3, the counts represent the intensity of optical emissions having a wavelength of 362 nm during plasma etching the semiconductor device 100 of FIG. 2.

As illustrated in FIG. 3, shortly after powering up the plasma etching chamber, the intensity of the emissions quickly achieves a level of over 1600 counts. After approximately 30 seconds, the intensity begins decreasing. At approximately 40 seconds, the intensity reaches a steady-state level of just below about 1500 counts. It has been found that this change in intensity indicates that the amorphous silicon layer 34 has been completely etched and that subsequent etching results in the etching of the titanium layer 32. At this point, the endpoint detector detects the change in intensity and sends a signal to the plasma etching chamber to terminate the etching. As shown in FIG. 3, the endpoint detector sends the termination signal to the plasma etching chamber which then cuts the power to the plasma etching chamber at about 47 seconds, thereby terminating the etching before the titanium layer 32 is etched. The endpoint detection system, consistent with the present invention, may use any conventional endpoint detection mechanism to terminate the etching when the change in intensity is detected.

According to embodiments of the present invention, the endpoint detection 30 trigger may be set to any desired level. For example, according to an exemplary embodiment, the endpoint detector may be set to detect when the intensity decreases to a certain percentage of the steady-state value or average value measured over a predetermined period. For example, suppose that the average intensity value between 10 seconds and 30 seconds in FIG. 3 is 1625 counts. The endpoint detector may be set to detect when the intensity falls below a certain percentage of the 1625 count value. For example, it has been found suitable to set the endpoint detector to detect an intensity of about 97% of the steady-state or average intensity value. In this scenario, when the spectral intensity reaches 97% of 1625, i.e., 1576 counts, the endpoint detector sends a signal to stop the etching. Other values may also be used as endpoint triggers, based on the particular user requirements. For example, the endpoint trigger may be set to 98% or more of the steady-state or average intensity for situations where partial over etching may be particularly undesirable. In other situations where some over etching may be desirable to ensure that the amorphous silicon layer 34 has been completely etched, the endpoint trigger may be set to 95% or lower.

Figure 4:
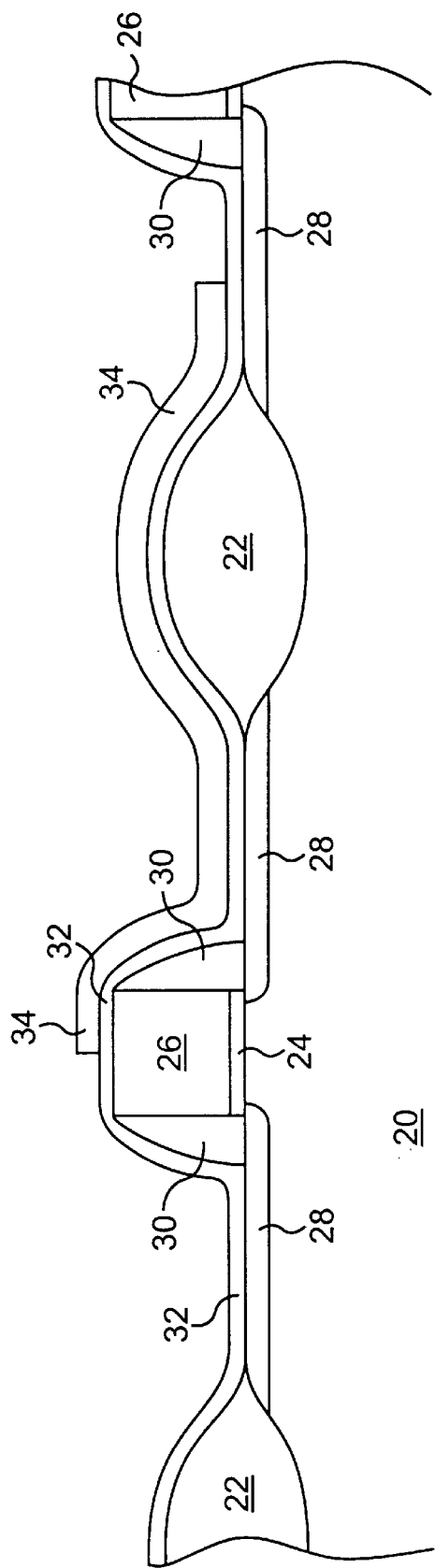
FIG. 4 illustrates the cross-section of the semiconductor device of FIG. 2 after plasma etching in accordance with an embodiment of the present invention.

After etching the amorphous silicon layer 34, the interconnect resist mask 36 is stripped in a conventional manner, resulting in the semiconductor device 100 illustrated in FIG. 4. Referring to FIG. 4, all the amorphous silicon has advantageously been removed, except in areas where the local interconnect is to be formed. Additionally, the titanium layer 32 has not been etched, thereby leaving sufficient titanium for forming titanium silicide on the surface of the semiconductor device 100.

A post-etch cleaning may then be performed to remove any polymer residues on the semiconductor device 100, formed as a by-product of the etching. According to an embodiment of the present invention, a solvent such as ACT 970, manufactured by Ashland-ACT, Inc., may be advantageously employed to clean the residue without attacking the underlying titanium. For example, according to an exemplary embodiment of the present invention, the semiconductor device 100 in FIG. 4 may be treated with ACT 970 and heated for about five to ten minutes at a temperature of about 85° C.±5° C. Advantageously, using such a solvent for this particular amount of time at this temperature has been found to leave a clean, smooth surface without polymer residues. Additionally, such a cleaning has also been found to clean the post-etch polymer residue without attacking the underlying titanium layer 32.

Figure 5:
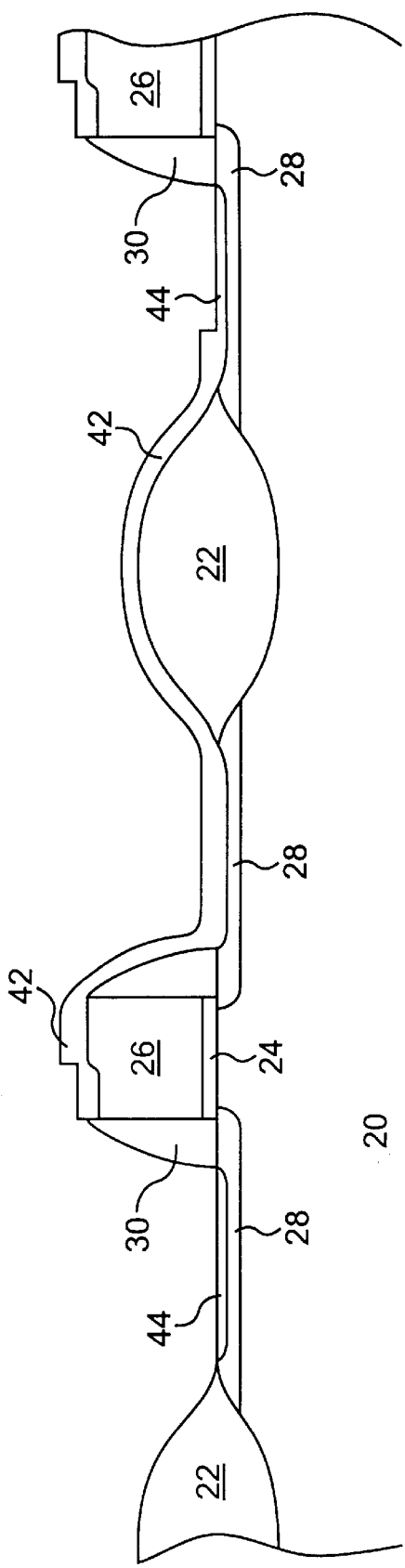
FIG. 5 illustrates the cross-section of a local interconnect conductor formed in accordance with an embodiment of the present invention.

After cleaning the semiconductor device 100, a conventional high temperature rapid thermal anneal (RTA) may be conducted to form titanium silicide interconnect layer 42, as illustrated in FIG. 5. The titanium in the titanium layer 32 (FIG. 4) reacts with the silicon in amorphous silicon layer 34 (FIG. 4) to form a titanium silicide local interconnect conductor 42. It should also be noted that the titanium located over the source/drain regions 28 also reacts with the silicon in the source/drain regions 28 to form titanium silicide regions 44 at the surface of the semiconductor substrate 20. Additionally, titanium located over the gate electrode 26 also reacts with the silicon in the gate electrode 26 to form titanium silicide at the upper portion of the gate electrode 26. After the RTA step, a titanium strip is conducted to remove any unreacted titanium on the semiconductor device 100.

Thus, in accordance with the present invention, a silicon layer formed over a titanium layer is precisely etched using a plasma etcher equipped with endpoint control. Advantageously, the amorphous silicon etching may be performed without under-etching the amorphous silicon layer or over-etching into the titanium layer. This permits a subsequently formed titanium silicide layer to have increased reliability, thereby improving the reliability of the semiconductor device. The present invention is also cost effective and can be easily integrated into conventional processing.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the thrust of the present invention.

The dielectric and conductive layers utilized in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed. The present invention is applicable in the manufacturing of semiconductor devices and particularly in semiconductor devices with design features of 0.25 microns and below, with increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

For example, the present invention has been described with the example of forming a local interconnect by etching an amorphous silicon layer over a titanium layer and then annealing. The present invention is also applicable to other situations where an amorphous silicon layer must be selectively etched to form other structures for other purposes.

What is claimed is:

1. A method for etching a semiconductor device in a plasma etching chamber, the semiconductor device comprising a silicon layer formed over a titanium layer, the method comprising:

providing $CF_4$ into the plasma etching chamber;

providing $N_2$ into the plasma etching chamber;

etching the semiconductor device in the plasma etching chamber;

monitoring optical emissions from the plasma etching chamber having wavelengths ranging from about 360 nm to about 364 nm; and terminating the etching when an intensity of the optical emissions reaches a predetermined level.

2. The method of claim 1, comprising:

providing $CF_4$ at a flow rate from about 75 sccm to about 95 sccm, and providing $N_2$ at a flow rate from about 10 sccm to about 20 sccm.

3. The method of claim 1, further comprising:

maintaining a pressure in the plasma etching chamber from about 900 mT to about 1100 mT.

4. The method of claim 1, comprising:

terminating the etching when the intensity of the optical emissions reaches approximately 97% of an average value over a predetermined period.

5. The method of claim 1, further comprising:

setting an endpoint detection device to detect an endpoint representing the predetermined level.

6. A method for etching a semiconductor device in a plasma etching chamber, the semiconductor device comprising a silicon layer formed over a titanium layer, the method comprising:

providing $CF_4$ into the plasma etching chamber;

providing $N_2$ into the plasma etching chamber;

etching the semiconductor device in the plasma etching chamber;

monitoring optical emissions from the plasma etching chamber having a wavelength of about 362 nm; and terminating the etching when an intensity of the optical emissions reaches a predetermined level.

7. A method of manufacturing a semiconductor device, comprising:

forming a dielectric layer on an upper surface of a semiconductor substrate;

forming a gate electrode on the dielectric layer;

sequentially depositing a titanium layer and a silicon layer over the gate electrode;

forming a mask over predetermined portions of the silicon layer, the predetermined portions defining a local interconnect line;

etching the silicon layer in a plasma etching chamber, the etching comprising:
provinding $CF_4$ into the plasma etching chamber at a flow rate ranging from about 75 sccm to about 95 sccm, and
providing $N_2$ into the plasma etching chamber at a flow rate ranging from about 10 sccm to about 20 sccm;

monitoring optical emissions from the plasma etching chamber; and terminating the etching when an intensity of the optical emissions reaches a predetermined level.

8. The method of claim 7, further comprising:

removing the mask; and annealing the semiconductor device to form a titanium silicide interconnect conductor.

9. The method of claim 8, further comprising:

cleaning the semiconductor device of post etching residue before annealing the semiconductor device.

10. The method of claim 7, wherein the etching includes:

maintaining a pressure in the plasma etching chamber from about 900 mT to about 1100 mT.

11. The method of claim 7, comprising:

monitoring optical emissions having wavelengths from about 360 nm to about 364 nm.

12. The method of claim 7, comprising:

monitoring optical emissions having a wavelength of about 362 nm.

13. The method of claim 7, further comprising:

setting an endpoint detection device to detect an endpoint representing the predetermined level.

14. A method for forming a local interconnect in a semiconductor device, comprising:

forming a dielectric layer on an upper surface of a semiconductor substrate;

forming a gate electrode on the dielectric layer;

sequentially depositing a titanium layer and an amorphous silicon layer over the gate electrode;

forming a resist mask over predetermined portions of the silicon layer, the predetermined portions defining the local interconnect;

providing $CF_4$ to a plasma etching chamber at a flow rate from about 75 sccm to to about 95 sccm;

providing $N_2$ to the plasma etching chamber at a flow rate from about 10 sccm to about 20 sccm;

maintaining a pressure in the plasma etching chamber from about 900 mT to about 1100 mT;

etching the semiconductor device;

monitoring optical emissions from the plasma etching chamber;

terminating the etching when an intensity of the optical emissions reaches a predetermined level;

removing the mask; and annealing the semiconductor device to form a titanium silicide local interconnect.

15. The method of claim 14, comprising:

monitoring optical emissions having a wavelength of about 362 nm.

16. The method of claim 14, comprising:

terminating the etching when the intensity of the optical emissions reaches approximately 97% of an average value over a predetermined period.

17. The method of claim 14, further comprising:

setting an endpoint detection device to detect an endpoint representing the predetermined level.

18. The method of claim 14, comprising:

monitoring optical emissions having wavelengths ranging from about 360 nm to about 364 nm.

\* \* \* \* \*